(12) United States Patent
Bernstein et al.

(10) Patent No.: US 7,389,478 B2
(45) Date of Patent: Jun. 17, 2008

(54) SYSTEM AND METHOD FOR DESIGNING A LOW LEAKAGE MONOTONIC CMOS LOGIC CIRCUIT

(75) Inventors: Kerry Bernstein, Underhill, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 11/407,176

(22) Filed: Apr. 19, 2006

(65) Prior Publication Data

US 2006/0208760 A1 Sep. 21, 2006

Related U.S. Application Data

(62) Division of application No. 10/710,453, filed on Jul. 13, 2004, now Pat. No. 7,084,667.

(51) Int. Cl.
*G06F 17/50* (2006.01)
(52) U.S. Cl. ............... 716/1; 716/2; 716/5; 326/81; 326/95; 326/98; 326/121
(58) Field of Classification Search ............... 716/1, 716/2, 5; 326/21, 31–39, 68, 81, 95–98, 326/108, 121
See application file for complete search history.

(56) References Cited

U.S. PATENT DOCUMENTS

| | | | |
|---|---|---|---|
| 6,040,707 A | 3/2000 | Young et al. | |
| 6,249,145 B1 | 6/2001 | Tanaka et al. | |
| 6,624,665 B2 * | 9/2003 | Kim et al. | 326/95 |
| 6,635,934 B2 | 10/2003 | Hidaka | |
| 6,838,911 B2 * | 1/2005 | Forbes | 326/98 |
| 6,946,879 B2 * | 9/2005 | Forbes | 326/121 |
| 7,084,667 B2 * | 8/2006 | Bernstein et al. | 326/81 |
| 2002/0008999 A1 | 1/2002 | Hidaka | |

* cited by examiner

*Primary Examiner*—Vuthe Siek
(74) *Attorney, Agent, or Firm*—Schmeiser, Olsen & Watts; Richard M. Kotulak

(57) ABSTRACT

A low leakage monotonic CMOS logic circuit and a method, a method of design and a system for designing such circuits. The circuit, including: one or more logic stages, at least one of the logic stages having a predominantly high input state or having a predominantly low input state; wherein the logic stages having the predominantly high input state, comprise one or more thin gate dielectric and high threshold voltage PFETs with respect to a reference PFET and one or more thick gate dielectric and low threshold voltage NFETs with respect to a reference NFET; and wherein the logic stages having the predominantly low input state, comprise one or more thick gate dielectric and low threshold voltage PFETs with respect to the reference PFET and one or more thin gate dielectric and high threshold voltage NFETs with respect to the reference NFET.

6 Claims, 10 Drawing Sheets

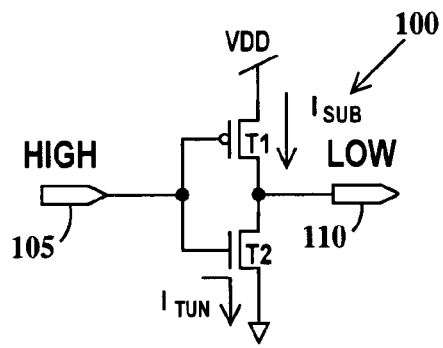
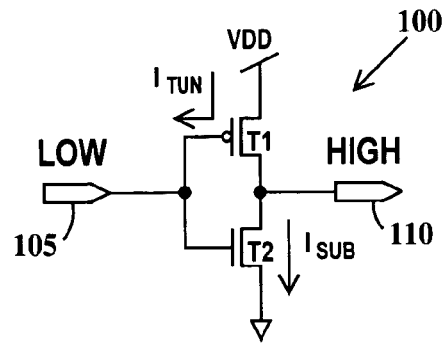
*FIG. 1A*  *FIG. 1B*
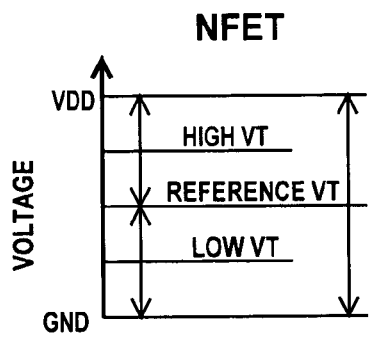
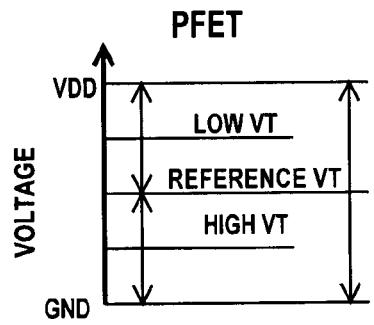
*FIG. 2A*  *FIG. 2B*
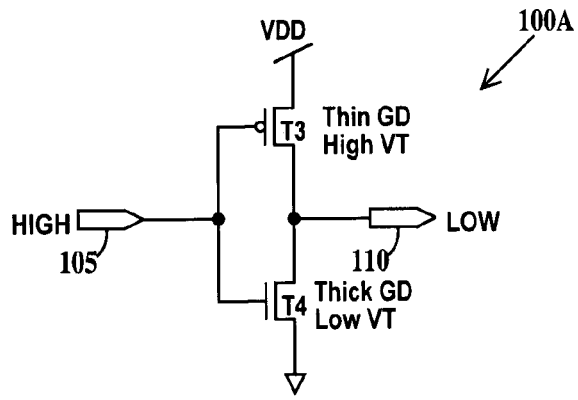
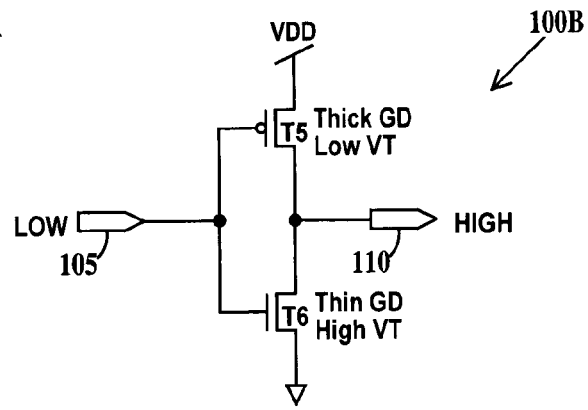
*FIG. 3*  *FIG. 4*

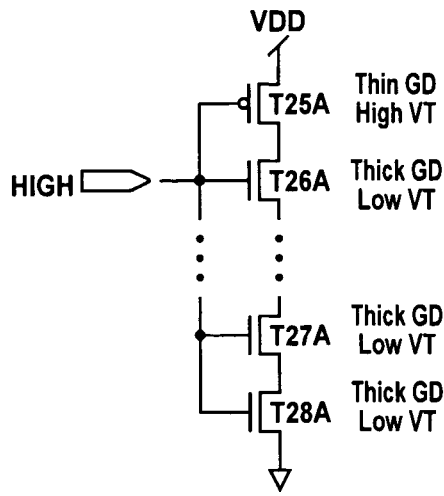
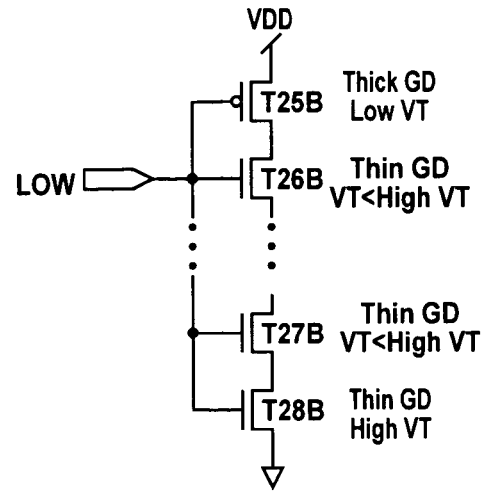
*FIG. 9A*                *FIG. 9B*
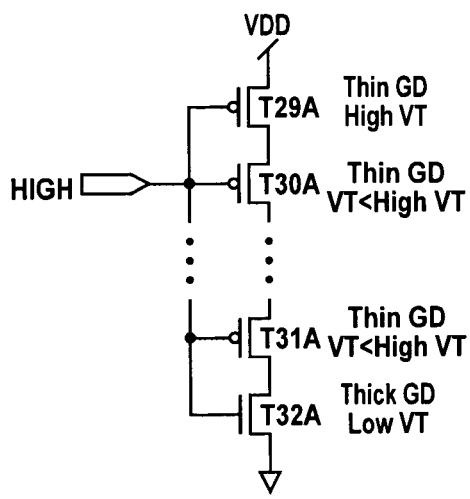
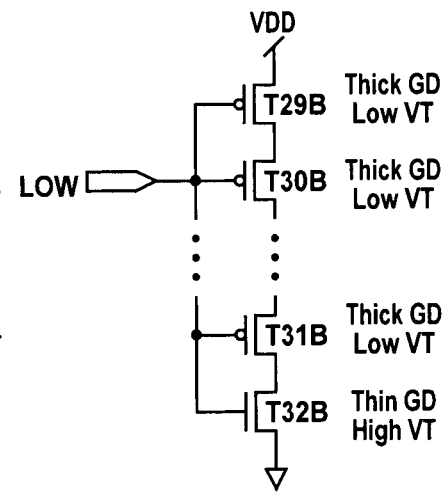
*FIG. 10A*               *FIG. 10B*
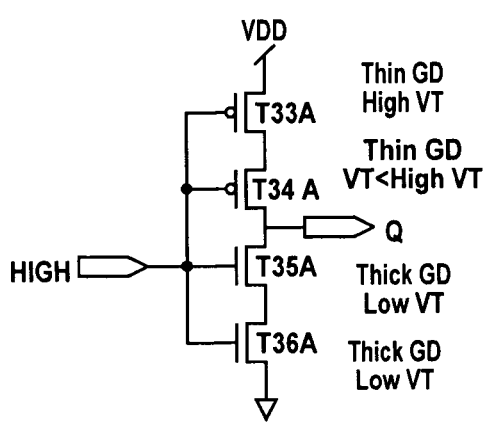
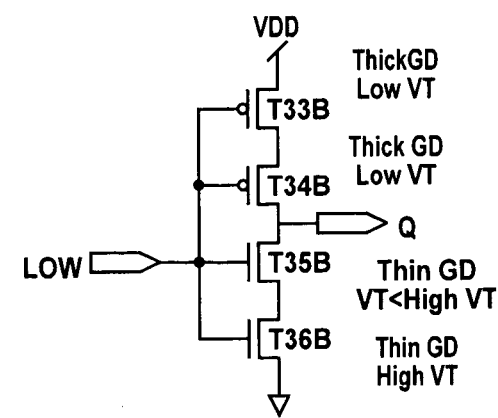
*FIG. 11A*               *FIG. 11B*

SYSTEM AND METHOD FOR DESIGNING A LOW LEAKAGE MONOTONIC CMOS LOGIC CIRCUIT

This application is a divisional and claims priority of application Ser. No. 10/710,453 filed on Jul. 13, 2004 now U.S. Pat. No. 7,084,667.

FIELD OF THE INVENTION

The present invention relates to the field of digital circuits; more specifically, it relates to monotonic complimentary metal-oxide-silicon (CMOS) digital circuits and a method of controlling leakage current in monotonic CMOS logic circuits.

BACKGROUND OF THE INVENTION

An increasing concern in advanced digital circuit design is the control of leakage current, especially when the digital logic circuit is in the precharge or standby state, which is often the predominant state in terms of the amount of time that the circuit is in that state compared to states of the circuit. High leakage current can result in the case of battery operated devices, reduced device operating time. Therefore, there is a need for reduced leakage current circuits and method for reducing leakage current in digital CMOS logic circuits.

SUMMARY OF THE INVENTION

A first aspect of the present invention is an integrated circuit, comprising: one or more logic stages, at least one of the logic stages having a predominantly high input state or having a predominantly low input state; wherein the logic stages having the predominantly high input state, comprise one or more thin gate dielectric and high threshold voltage PFETs with respect to a reference PFET and one or more thick gate dielectric and low threshold voltage NFETs with respect to a reference NFET; and wherein the logic stages having the predominantly low input state, comprise one or more thick gate dielectric and low threshold voltage PFETs with respect to the reference PFET and one or more thin gate dielectric and high threshold voltage NFETs with respect to the reference NFET.

A second aspect of the present invention is a method of reducing leakage current in a circuit, comprising: specifying a reference PFET having its threshold voltage and its gate dielectric thickness and a reference NFET having its threshold voltage and its gate dielectric thickness; providing the circuit, the circuit having one or more logic stages; connecting at least one of the logic stages to an input having a predominantly high input state or having a predominantly low input state; wherein the logic stages connected to the input having the predominantly high input state, comprise one or more thin gate dielectric and high threshold voltage PFETs with respect to the reference PFET and one or more thick gate dielectric and low threshold voltage NFETs with respect to the reference NFET; and wherein the logic stages connected to the input having the predominantly low input state, comprise one or more thick gate dielectric and low threshold voltage PFETs with respect to the reference PFET and one or more thin gate dielectric and high threshold voltage NFETs with respect to the reference NFET.

A third aspect of the present invention is a method of designing a monotonically operated CMOS circuit having reduced leakage current, comprising: specifying a reference PFET having its threshold voltage and its gate dielectric thickness and a reference NFET having its threshold voltage and its gate dielectric thickness; defining a CMOS logic circuit having logic stages, the logic stages having input states; defining a thin gate dielectric and high threshold voltage PFET with respect to the reference PFET, for any of the logic stages having a predominantly high input state; defining a thick gate dielectric and low threshold voltage NFET with respect to the reference NFET, for any of the logic stages having the predominantly high input state; defining a thick gate dielectric and low threshold voltage PFET with respect to the reference PFET, for any of the logic stage having a predominantly low input state; and defining a thin gate dielectric and high threshold voltage NFET with respect to the reference NFET, for any of the logic stages having the predominantly low input state.

A fourth aspect of the present invention is a method of designing a monotonically operated CMOS circuit with reduced current leakage, (a) specifying a reference PFET having its threshold voltage and its gate dielectric thickness and a reference NFET having its threshold voltage and its gate dielectric thickness; (b) synthesizing a schematic circuit design with standard design elements, the standard design elements including one or more reference PFETS and one or more reference NFETs; (c) analyzing one or more circuits for logic stages having predominantly high input logic states or predominantly low input logic states; (d) selecting one or more logic stages determined to have predominantly high input logic states or predominantly low input logic states; and (e) replacing the standard design elements of the selected logic stages with reduced current leakage elements, the reduced current leakage elements including: thin gate dielectric and high threshold voltage PFETs with respect to the reference PFET, for logic stages having predominantly high input states; thick gate dielectric and low threshold voltage NFETs with respect to the reference NFET, for logic stages having predominantly high input states; thick gate dielectric and low threshold voltage PFETs with respect to the reference PFET, for a logic stages having predominantly low input states; and thin gate dielectric and high threshold voltage NFETs with respect to the reference NFET, for the logic stages having predominantly low input states.

A fifth aspect of the present invention is a computer system comprising a processor, an address/data bus coupled to the processor, and a computer-readable memory unit coupled to the processor, the memory unit containing instructions that when executed by the processor implement a method for designing a monotonic CMOS circuit with reduced current leakage, the method comprising the computer implemented steps of: (a) specifying a reference PFET having its threshold voltage and its gate dielectric thickness and a reference NFET having its threshold voltage and its gate dielectric thickness; (b) synthesizing a schematic circuit design with standard design elements, the standard design elements including one or more reference PFETS and one or more reference NFETs; (c) analyzing one or more circuits for logic stages having predominantly high input logic states or predominantly low input logic states; (d) selecting one or more logic stages determined to have predominantly high input logic states or predominantly low input logic states; and (e) replacing the standard design elements of the selected logic stages with reduced current leakage elements, the reduced current leakage elements including: thin gate dielectric and high threshold voltage PFETs with respect to the reference PFET, for logic stages having predominantly high input states; thick gate dielectric and low threshold voltage NFETs with respect to the reference NFET, for logic stages having predominantly high input states; thick gate dielectric and low threshold voltage PFETs with respect to the reference PFET, for a logic stages having predominantly low input states; and thin gate dielectric and high threshold voltage NFETs with respect to the reference NFET, for the logic stages having predominantly low input states.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1A and 1B are exemplary schematic circuit diagrams illustrating sources of leakage current in CMOS logic circuits in general and monotonic circuits in particular;

FIG. 2A illustrates the definition of a low and high VT for an NFET and FIG. 2B illustrates the definition of high and low VT for a PFET;

FIGS. 3 and 4 are exemplary schematic circuit diagrams illustrating a method of reducing leakage current in monotonic CMOS logic circuits according to the present invention;

FIGS. 9A, 9B, 10A, 10B, 11A and 11B are schematic circuit diagrams illustrating application of the method of reducing leakage current in pulsed static logic circuit applications according to the present invention;

DETAILED DESCRIPTION OF THE INVENTION

Figure 5:
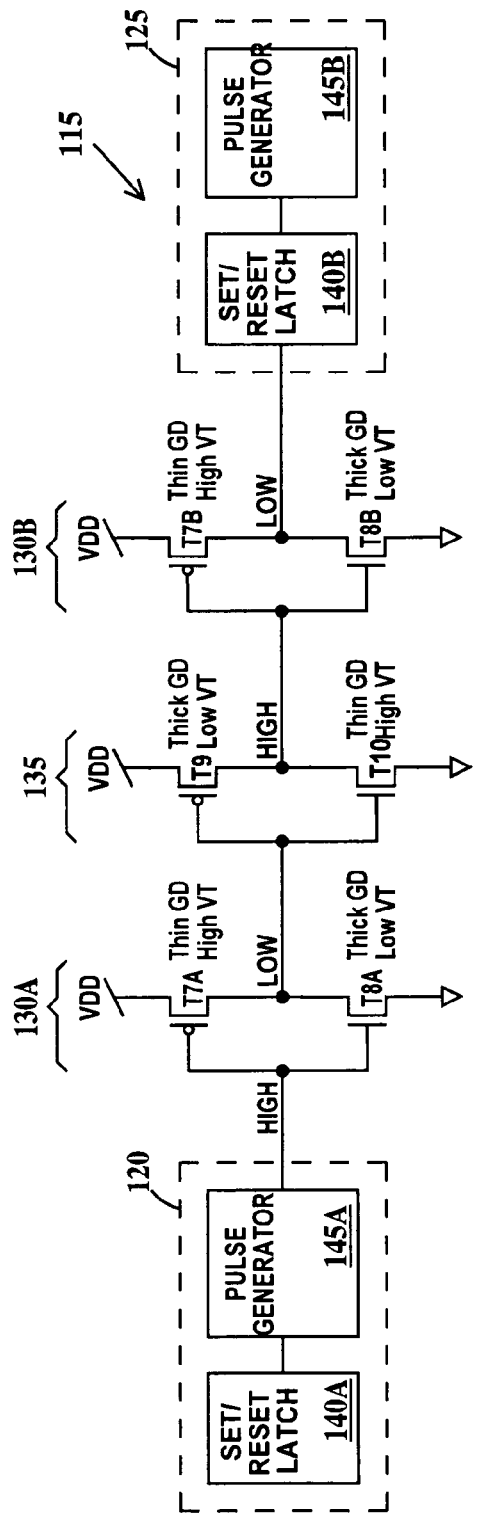
FIG. 5 is a schematic diagram of a first exemplary pulsed static CMOS logic circuit according to the present invention.

For the purposes of the present invention the term "high" on an input, output or circuit node means a logical one on the input, output or circuit node and the term "low" means a logical zero on the input, output or circuit node. A logical one also corresponds to a voltage level sufficient to turn on an N-channel field effect transistor (NFET) and is often also VDD. A logical zero corresponds to a voltage level sufficient to turn on a P-channel field effect transistor (PFET) and is often also GND. These usages of high and low should not be confused with the terms high and low threshold voltage (VT), which are defined infra. VDD and GND may also be considered as first and second rails of a power supply.

FIGS. 1A and 1B are exemplary schematic circuit diagrams illustrating sources of leakage current in CMOS logic circuits in general and monotonic circuits in particular. A monotonic circuit is defined as a circuit that requires no clock signal for propagation of data through the combinational logic path of the circuit and always evaluates in a fixed direction from low to high or high to low. In FIGS. 1A and 1B, an inverter 100 includes a PFET T1 and an NFET T2. The source of PFET T1 is connected to VDD and the source of NFET T2 is connected to ground. The gates of PFET T1 and NFET T2 are connected to an input 105 and the drains of PFET T1 and NFET T2 are connected to an output 110. In operation, a high on input 105 turns on NFET T2, turns off PFET T1 and causes output 110 to go high.

As illustrated in FIG. 1A, with a high on input 105, the principle leakage current of PFET T1 is sub-threshold voltage leakage current ISUB from VDD to output GND and the principle leakage current of NFET T2 is gate dielectric tunneling $I_{TUN}$ leakage current from input 105 to GND. As illustrated in FIG. 1B, with a low on input 105, the principle leakage current of PFET T1 is gate dielectric tunneling leakage current $I_{TUN}$ from VDD to input 105 and the principle leakage current of NFET T2 is sub-threshold voltage leakage current $I_{SUB}$ and from VDD to GND.

Gate dielectric tunneling leakage is the flow of current between a FETs gate and inversion region and between the FETs gate and substrate/body when the gate and body are at different voltage levels, which will occur when the FET is on. Sub-threshold leakage is the flow of current from the drain to the source of an FET and when the gate and the source of the FET are at the same voltage, which will occur when the FET is off and is due to the barrier height presented to the majority carrier.

Before proceeding, the concept of a reference NFET and a reference PFET will be introduced in terms of well known principles of semiconductor physics such as may be found in any good textbook on the subject such as Physics of Semiconductor Devices" by S, M. Sze, published by John Wiley & Sons. The performance or switching speed of a FET is defined by a maximum operating frequency $f_m$, the higher the $f_m$ the faster the switching speed and the lower the $f_m$ the slower the switching speed. The design parameters of a bulk silicon FET include gate width (W), gate length (L), silicon dopant species concentration (N), silicon permittivity ($\in_s$), gate dielectric permittivity ($\in_i$), and gate dielectric thickness (d) among others, but these are the primary design parameters. Note the capacitance of gate dielectric ($C_i$) in an FET is given $C_i = \in_i / d$.

The VT of an FET is a function of the constants $\in_s$ and the electron charge (q), the potential at flat-band ($\Psi_B$) which is the difference the between the Fermi level of the doped silicon ($E_F$) (itself a function of N) and the Fermi level of intrinsic silicon (Ei), N and $C_i$. If in a reference FET, W, L, N, $\in_s$ and d are fixed (thus fixing $C_i$ as well). Therefore the VT of the FET is fixed as well.

The $f_m$ of an FET is a function of the constants π and the electron mobility ($\mu_n$), L, VT and the voltage on the gate (VG). If in a FET, L and VT are fixed then the $f_m$ of the FET is fixed as well.

Holding everything but VT and $C_i$ constant, the following statements will be true for any FET: (1) The higher the VT, the slower the FET; the lower the VT, the faster the FET and (2) The thicker the gate dielectric, the slower the FET and the thinner the gate dielectric the faster the FET.

Therefore, a reference NFET is defined herein as an NFET having a gate dielectric thickness and threshold voltage selected to meet the performance requirements described supra. Further, a reference PFET is defined herein as a PFET having a gate dielectric thickness and threshold voltage selected to meet the performance requirements described supra.

FIG. 2A illustrates the definition of a low and high VT for an NFET relative to a reference NFET and FIG. 2B illustrates the definition of high and low VT for a PFET relative to a reference PFET.

In FIG. 2A, it can be seen that (1) the VT of a reference NFET has a value between voltage levels VDD and GND, (2) the VT of a high VT NFET has a value between the voltage level of the VT of the reference NFET and VDD and (3) the VT of a low VT NFET has a value between the voltage level of the VT of the reference NFET and GND. Therefore, a high VT NFET is an NFET having a VT higher than the VT of the reference NFET and a low VT NFET is s an NFET having a VT lower than the VT of the reference NFET, holding other design parameters (with the possible exception of $C_i$) to fixed values as described supra.

In FIG. 2B, it can be seen that (1) the VT of the reference PFET has a value between voltage levels VDD and GND, (2) the VT of a high VT PFET has a value between the voltage level of the VT of the reference PFET and GND and (3) the VT of a low VT PFET has a value between the voltage level of the VT of the reference PFET and VDD. Therefore, a high VT PFET is a PFET having a VT lower than the VT of the reference PFET and a low VT PFET is a PFET having a VT higher than the VT of the reference PFET, holding other design parameters (with the possible exception of $C_i$) to fixed values as described supra.

When comparing gate dielectric thicknesses, electrically equivalent gate dielectric thicknesses are compared. The electrically equivalent gate dielectric thickness takes into account the different permittivity of different dielectric materials, because it is possible for a thin layer of a dielectric material with a high permittivity to have a higher electrically equivalent gate dielectric thickness than a physically thicker layer of a dielectric material with a lower permittivity. Since thermal silicon oxide is a traditional, well characterized and common dielectric material, gate dielectric thickness is often described in terms of thermal silicon oxide equivalent (TOXeq) thickness which is the physical thickness of the gate dielectric multiplied by the ratio of the permittivity of thermal silicon oxide divided by the permittivity of the material of the gate dielectric. The term electrically equivalent gate dielectric thickness is normally shortened to equivalent gate dielectric thickness.

Therefore, a thick gate NFET is an NFET having a TOXeq gate dielectric thickness greater than a TOXeq gate dielectric thickness of the reference NFET, holding other design parameters (with the possible exception of VT) to fixed values as described supra. Further, a thin gate PFET is a PFET having a TOXeq gate dielectric thickness less than a TOXeq gate dielectric thickness of the reference PFET, holding other design parameters (with the possible exception of VT) to fixed values as described supra. Note the definitions of thick/thin gate dielectric PFETs and NFETs are independent of the definitions of high/low VT PFETs and NFETs.

Thus, a thin gate dielectric and high threshold voltage PFET is defined herein with respect to the reference PFET, a thick gate dielectric and low threshold voltage PFETs defined herein with respect to the reference PFET, a thin gate dielectric and high threshold voltage NFET is defined herein with respect to the reference NFET, and a thick gate dielectric and low threshold voltage NFETs defined herein with respect to the reference NFET.

A first method to increase or decrease equivalent gate dielectric thickness is to increase or decrease the physical thickness (d) of the gate dielectric without changing its material composition. A second method to increase or decrease equivalent gate dielectric thickness is the change the material composition to a material with a lower or higher permittivity ($\in_i$) as discussed supra.

Returning to FIGS. 1A and 1B, if PFET T1 is further described as reference PFET and NFET T1 is described as a reference NFET based on the definitions supra, then the operation of the present invention will be better understood by comparison of inverter 100 of FIGS. 1A and 1B to the inverters illustrated in FIGS. 3 and 4 and described infra.

FIGS. 3 and 4 are exemplary schematic circuit diagrams illustrating a method of reducing leakage current in monotonic CMOS logic circuits according to the present invention. In FIG. 3, inverter 100A is similar to inverter 100 of FIG. 1A, except PFET T1 and NFET T2 of FIG. 1A are replaced with PFET T3 and NFET T4 respectively and a predominate state of input 105 is high. That is, input 105 is high for a longer period of time than it is low during the time the integrated circuit chip is coupled to VDD and GND. Thus, a predominantly high input state of and input to a logic circuit (or of a gate of an NFET or PFET) is defined herein as a state where the input (or gate) is high more than 50% of time, statistically over an extended period of time and a predominantly low input state of and input to a logic circuit (or of a gate of an NFET or PFET) is defined herein as a state where the input (or gate) is low more than 50% of time, statistically over an extended period of time. Examples of states that may be predominantly high or low states include standby states and precharge states. PFET T3 is a thin gate dielectric, high VT PFET and NFET T4 is a thick gate dielectric, low VT NFET. The high VT of PFET T3 reduces sub-threshold leakage through PFET T3 and the thick gate dielectric of NFET T4 reduces gate dielectric tunneling leakage through NFET T4. A high VT slows down PFET T3 so PFET T3 is also a thin gate dielectric PFET, which tend to compensate for the loss of speed (i.e. reduction in the maximum operating frequency of the PFET) caused by the high VT of PFET T3. Note the thin gate dielectric of PFET T3 does not substantially increase gate dielectric tunneling leakage because the gate and the body of PFET T3 are both predominantly at potential VDD. A thick gate dielectric slows down the operation of NFET T4 so NFET T4 is also a low VT NFET, which tends to compensate for the loss of speed caused by the thick gate dielectric of NFET T4.

In FIG. 4, inverter 100B is similar to inverter 100 of FIG. 1A, except PFET T1 and NFET T2 of FIG. 1A are replaced with PFET T5 and NFET T6 respectively and a predominate state of input 105 is low. That is, input 105 is low for a longer period of time than it is high during operation of an integrated circuit chip (or portion thereof) that contains and uses inverter 100B. PFET T5 is a thick gate dielectric, low VT PFET and NFET T5 is a thin gate dielectric, high VT NFET. Note the thin gate dielectric of NFET T6 does not increase gate dielectric tunneling leakage because the gate and the body of NPFET T6 are both at GND. The thick gate dielectric of PFET T5 reduces gate dielectric tunneling leakage through PFET T5 and the high VT of NFET T6 reduces sub-threshold leakage through NFET T6. A thick gate dielectric slows down PFET T5 so PFET T5 is also a low VT PFET, which tend to compensate for the loss of speed (i.e. reduction in the maximum operating frequency of the NFET) caused by the thick gate dielectric of PFET T5. A high VT slows down the operation of NFET T6 so NFET T6 is also a thin gate dielectric VT NFET, which tend to compensate for the loss of speed caused by the high VT of NFET T4.

From FIGS. 3 and 4, two rules for reducing leakage current in a monotonic CMOS circuit can be thus stated:

Rule 1: When the predominate state of the input(s) to the circuit is high, all PFETs in the circuit should be thin gate dielectric/high VT PFETS and all NFETs in the circuit should be thick gate dielectric/low VT NFETs.

Rule 2: When the predominate state of the input(s) to the circuit is low, all PFETs in the circuit should be thick gate dielectric/low VT PFETS and all NFETs in the circuit should be thin gate dielectric/high VT NFETs.

FIG. 5 is a schematic diagram of a first exemplary pulsed static CMOS logic circuit according to the present invention. In FIG. 5, a delay circuit 115 is includes a dynamic input latch 120, a dynamic output latch 125, identical to dynamic input latch 120, inverters 130A and 130B including a PFETs T7A and T7B and NFETs T8A and T8B respectively and an inverter 135 including a PFETs T9 and an NFETs T10. The input of inverter 130A is connected to the output of dynamic input latch 120 and the output of inverter 130B is connected to the input of dynamic latch 125. The input of inverter 135 is connected to the output of inverter 130A and the output of inverter 135 is connected to the input of inverter 130B. Dynamic input and output latches 120 and 125 include set/reset (S/R) latches 140A and 140B respectively and pulse generators 145A and 145B respectively.

In operation, data latched by S/R latch 140A is pulsed into serially connected inverters 130A, 135 and 130B by pulse generator 145A and the result latched by S/R latch 140B. Assuming that the predominate state of the output of dynamic latch 120 is high (thus setting the predominate state on the input of inverter 130A also to high), then the input of inverter 135 will have a predominate state of low and the input of inverter 130B will have a predominate state of high. Applying rules 1 and 2 described infra to circuit 115 dictates that PFETs T7A and T7B be thin gate dielectric/high VT PFETs, PFET T9 be a thick gate dielectric/low VT PFET, NFETs T8A and T8B be thick gate dielectric/low VT NFETs and NFET T10 be a thin gate dielectric/high VT NFET. Thus, the leakage in the predominate input state of circuit 115 is reduced.

Figure 6:
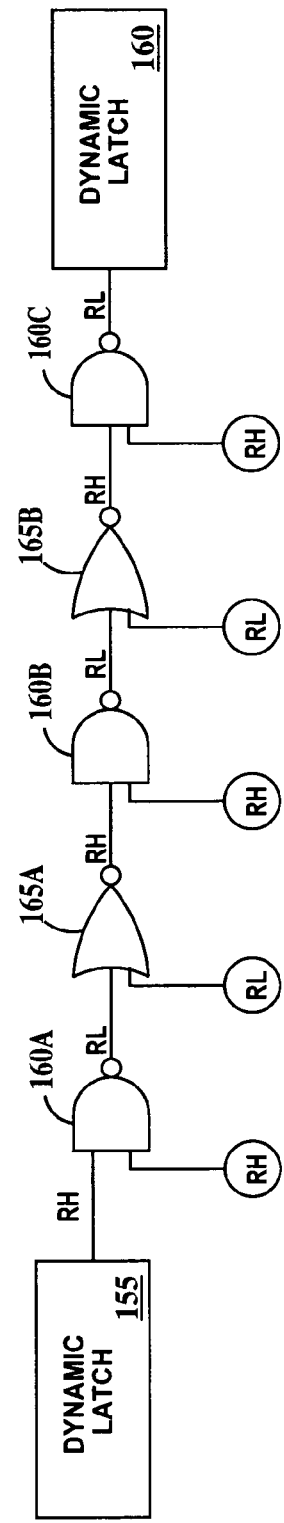
FIG. 6 is a schematic diagram of a second exemplary pulsed static CMOS logic circuit according to the present invention.

FIG. 6 is a schematic diagram of a second exemplary pulsed static CMOS logic circuit according to the present invention. In FIG. 6, a pulsed static CMOS circuit 150, includes a dynamic input latch 155, a dynamic output latch 160 and identical NAND gates 160A, 160B and 160C and identical NOR gates 165A and 165B. A first input of NAND gate is connected to the output of dynamic input latch 155. A first input of NOR gate 165A is connected to the output of NAND gate 160A. A first input of NAND gate 160B is connected to the output of NOR gate 165A. A first input of NAND gate 160B is connected to the output of NOR gate 165A. A first input of NOR gate 165B is connected to the output of NAND gate 160B. A first input of NAND gate 160C is connected to the output of NOR gate 165B. The output of NAND gate 160C is connected to the input of dynamic output latch 160. Note the NAND gates need not be identical and the NOR gates need not be identical and the number of inputs of to the NAND or NOR gates may be any number from two up, but are illustrated as such for simplicity. However, the predominate state of all inputs to a particular NAND gate must be the same and the predominate state of all inputs to a particular NOR gate must be the same.

The predominate output state of dynamic input latch 155 determines the predominate input state of all NAND gates 160A, 160B and 160C and NOR gate 165A and 165B. In FIG. 6, the predominate output state of dynamic input latch is reset high (RH), therefore the predominate state of all inputs to all NAND gates 160A, 160B and 160C is RH and the predominate state of both NOR gates 165A and 165B is reset low (RL). The description of the individual transistors of each NAND gate 160A, 160B and 160C and each NOR gate 165A and 165B required by the present invention to reduce the leakage current is illustrated in FIGS. 7A, 7B, 8A and 8B and described infra.

Figure 7A:
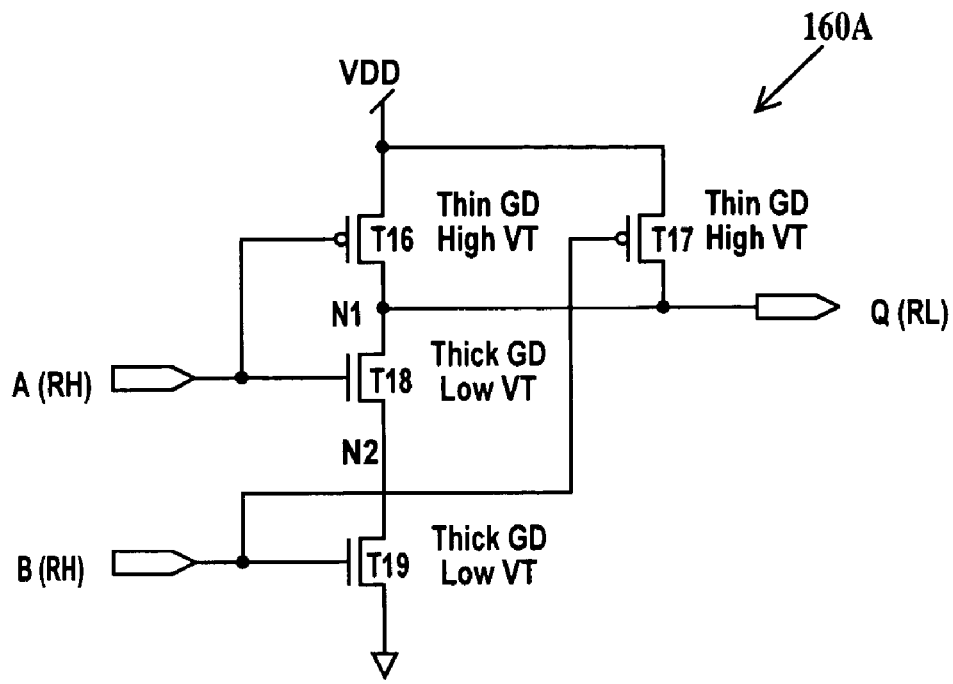
FIGS. 7A and 7B are a schematic circuit diagrams of a NAND gate of FIG. 6 according to the present invention the present invention.
Figure 7B:
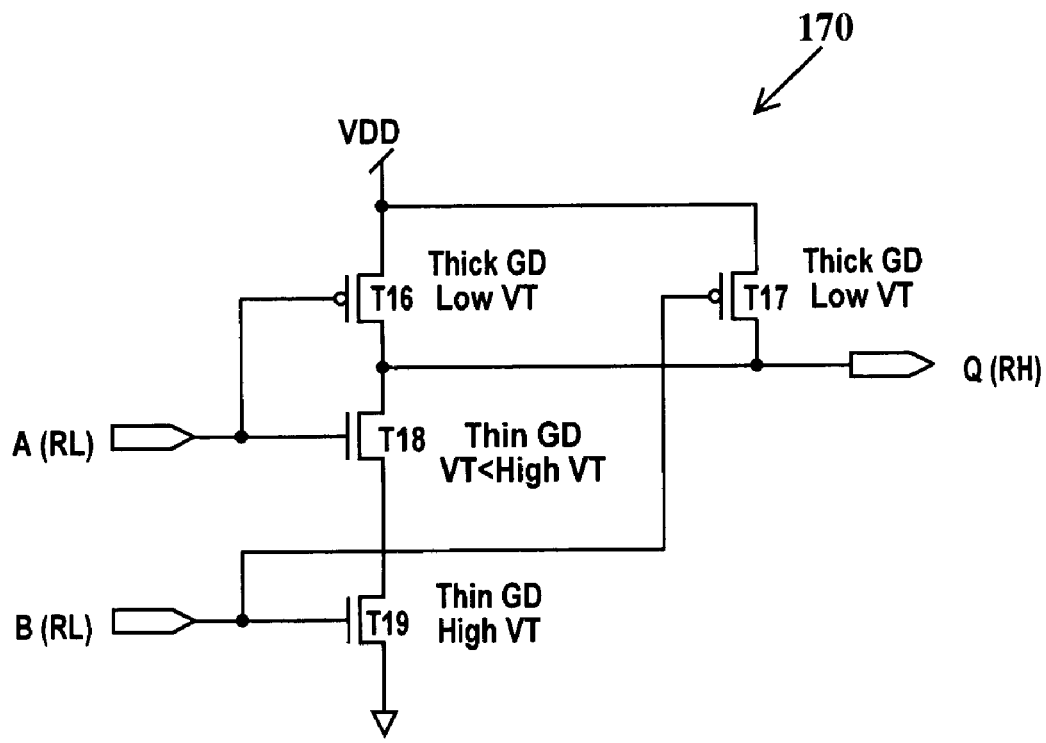

FIGS. 7A and 7B are a schematic circuit diagrams of a NAND gate of FIG. 6 according to the present invention the present invention. In FIG. 7A, NAND gate 160A (representing any of NAND gates 160A, 160B or 160C, includes PFETs T16 and T17 and NFETs T18 and T19. The gates of PFET T16 and NFET T18 are connected to an input A having a predominate state (RH) and the gates of PFET T17 and NFET T19 are connected to an input B having a predominate state (RH). The sources of PFETS T16 and T17 are connected to VDD and the source of NFET T19 is connected to GND. The drain of NFET T18 is connected to the drains of PFETs T16 and T17 and to an output Q. The drain of NFET T19 is connected to the source of NFET T18. According to rules 1 and 2 described infra, in order to reduce the leakage of NAND gate 160A, PFETs T16 and T17 are thin gate dielectric/high VT PFETS and NFETs T18 and T19 are thick gate dielectric/low VT NFETs. However, if the predominate state of NAND gate 160A were low, strict adherence to rules 1 and 2 results in a potential performance degradation of NAND gate 160A.

PFETs T16 or PFET T17 and NFETs T18 and T19 are "stacked" between VDD and GND, NFET T18 being a "intermediate" NFET, that is, an NFET gated from GND by at least one other NFET. Because NFET T18 is a "intermediate" NFET it is subject to a phenomena known as body effect (also called substrate bias effect). The body effect dynamically changes the VT of an NFET (or a PFET) during state transitions. With a low on input A, a node N1 between the drains of PFET T17 and NFET T18 goes high relative to the voltage on the source of NFET T18. With a transition to high on inputs A and B, a node N2 between the source of NDFET T18 and the drain of NFET T19 temporarily rises due to a voltage divider effect as node N1 is pulled low. This translates into decreased performance because the overdrive voltage ($V_{OD}$), which is a measure of performance, is the voltage between the gate and source ($V_{GS}$) minus $V_T$. The higher $V_T$ the less $V_{OD}$ and the less "hard" the FET is turned on at a given voltage. Since performance is measured in rise and fall time of a signal to a specified voltage level, it thus takes longer to reach a specified voltage level for $V_{OD}$ as $V_T$ increases. It is possible to optionally make a tradeoff between leakage and performance by adjusting the threshold voltage of NFET T18 as illustrated in FIG. 7B.

In FIG. 7B, a gate 170 is similar to NAND gate 160A of FIG. 7A except PFETs T16 and T17 are thick gate dielectric/low VT PFETs and NFET T19 is a thin gate dielectric/high VT NFET. NFET T18 is still a thin gate dielectric NFET, but its threshold voltage has been adjusted to a value less than that of a high VT NFET based on the definitions given supra in reference to FIGS. 2A and 2B.

Figure 8A:
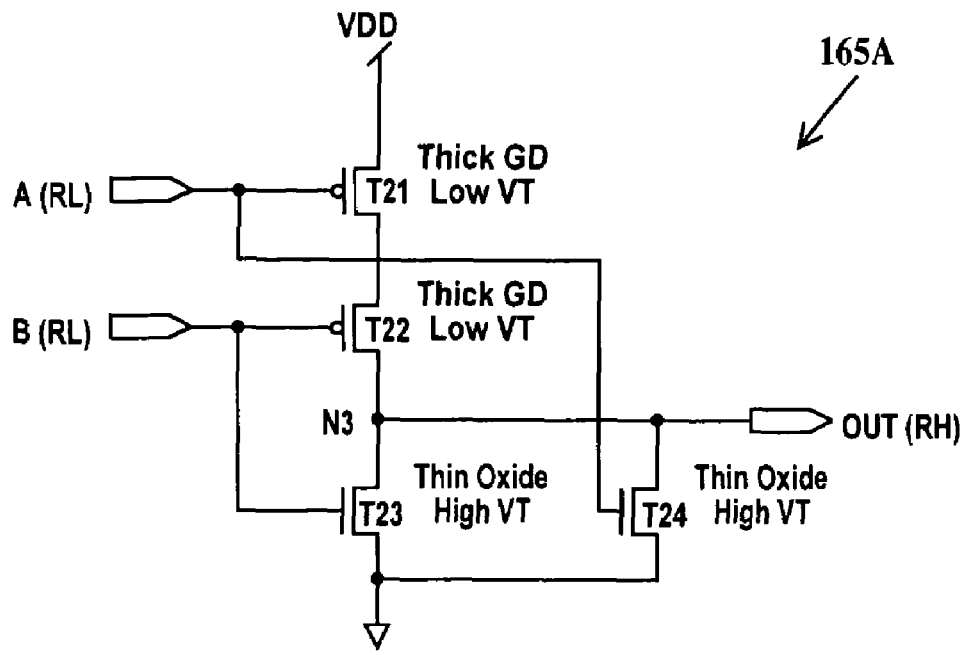
FIGS. 8A and 8B are a schematic circuit diagrams of a NOR gate of FIG. 6 according to the present invention the present invention.
Figure 8B:
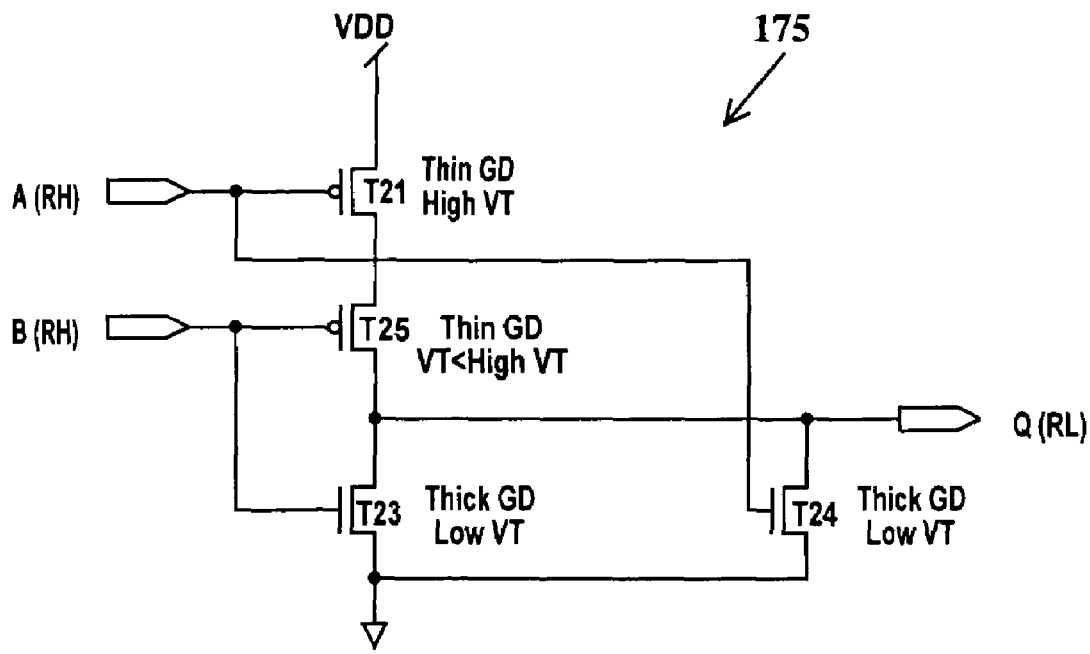

FIGS. 8A and 8B are a schematic circuit diagrams of a NOR gate of FIG. 6 according to the present invention. In FIG. 8A, NOR gate 165A (representing both of NAND gates 165A or 165B, includes PFETs T21 and T22 and NFETs T23 and T24. The gates of PFET T21 and NFET T24 are connected to an input A having a predominate state (RL) and the gates of PFET T22 and NFET T23 are connected to an input B having a predominate state (RH). The sources of NFETS T23 and T24 are connected to GND and the source of PFET T21 is connected to VDD. The drain of PFET T22 is connected to the drains of NFETs T23 and T24 and to an output Q. The drain of PFET T21 is connected to the source of PFET T22. According to rules 1 and 2 described infra, in order to reduce the leakage of NOR gate 165A, PFETs T21 and T22 are thick gate dielectric/low VT PFETS and NFETs T23 and T24 are thin gate dielectric/high VT NFETs. However, if the predominate state of NOR gate 165A were low, strict adherence to rules 1 and 2 results in a potential performance degradation of NOR gate 165A.

PFETs T21 and T22 and NFET T23 or NFET T24 are "stacked" between VDD and GND, PFET T22 being a "intermediate" PFET, that is, a PFET gated from VDD by at least one other PFET. Because PFET T22 is a "intermediate" PFET it is also subject body effects. With a high on input A, a node N3 between the drains of PFET T22 and NFET T23 goes high relative to the voltage on the source of PFET T22 resulting in a potential performance loss in PFET T22 in a manner similar to that described supra in relation to NFET T18 of FIG. 7A. Again, it is possible to optionally make a tradeoff between leakage and performance by adjusting the threshold voltage of PFET T22 as illustrated in FIG. 8B.

In FIG. 8B, a NOR gate 175 is similar to NOR gate 165A of FIG. 8A except PFET T21 is a thin gate dielectric/low VT PFET, NFETs T23 and T24 are thick gate dielectric/low VT NFETS and PFET T22 is still a thin gate dielectric PFET, but its threshold voltage has been adjusted to a value less than that of a high VT PFET based on the definitions given supra in reference to FIGS. 2A and 2B.

An intermediate PFET is defined herein as a PFET having its source gated from VDD by at least one other PFET wherein the PFETs are coupled in series from VDD to GND by source to drain connections. An intermediate NFET is defined herein as an NFET having its source gated from GND by at least one other NFET wherein the NFETs are coupled in series from VDD to GND by source to drain connections.

Before examining several addition FET "stacking" circuit arrangements, two optional rules for reducing leakage current in a monotonic CMOS circuit can be stated:

Rule 3: (Optional) When the predominate state of the input(s) to the circuit is high, all intermediate PFETs in the circuit should be thin gate dielectric PFETs with respect to a reference PFET and have threshold voltages less than that of a high VT PFET.

Rule 4: (Optional) When the predominate state of the input(s) to the circuit is low, all intermediate NFETs in the circuit should be thin gate dielectric NFETs with respect to a reference NFET and have threshold voltages less than that of a high VT NFET.

It should be noted that rules 1, 2, 3 and 4 for reducing leakage current described supra, define a CMOS integrated circuit topology, that is rules 1, 2, 3 and 4 define the interconnections of elements (in the present case specific types of NFETs and PFETs) for a CMOS integrated circuit.

FIGS. 9A, 9B, 10A, 10B, 11A and 11B are schematic circuit diagrams illustrating application of the method of reducing leakage current in pulsed static logic circuit applications according to the present invention. In FIG. 9A, a PFET T25A, and NFETs T26A through T28A are stacked between VDD and GND and the gates of PFET T25A and NFETs T26A through T28A share a common input with a predominate state of high. Rules 1 through 4 described infra have been applied. PFET T25A is a thin gate dielectric/high VT PFET, NFETs T26A through T28A are thick gate dielectric/low VT NFETs.

In FIG. 9B, a PFET T25B, and NFETs T26B through T28B are stacked between VDD and GND and the gates of PFET T25B and NFETs T26B through T28B share a common input with a predominate state of low. Rules 1 through 4 described infra have been applied. PFET T25B is a thick gate dielectric/low VT PFET, NFETs T26B through T27B are thin gate dielectric NFETs with $V_T$s less than that of a high VT NFET, and NFET T28B is a thin gate dielectric/high VT NFET.

In FIG. 10A, a PFETs T29A through T31A and an NFETs T32A are stacked between VDD and GND and the gates of PFETs T29A through T31A and NFET T32A share a common input with a predominate state of high. Rules 1 through 4 described infra have been applied. PFET T29A is a thin gate dielectric/high VT PFET, PFETs T30A through T31A are thin gate dielectric PFETs with $V_T$s less than that of a high VT PFET and NFET T32A is a thick gate dielectric/low VT NFET.

In FIG. 10B, a PFET T29B, and NFETs T30B through T31B are stacked between VDD and GND and the gates of PFET T29B through T31A and NFET T32B share a common input with a predominate state of low. Rules 1 through 4 described infra have been applied. PFETs T29B through T31B are thick gate dielectric/low VT PFETs and NFET T32B is a thin gate dielectric/high VT NFET.

In FIG. 11A, PFET T33A and T34A, and NFETs T35A and T36A are stacked between VDD and GND and the gates of PFETs T33A and T34A and NFETs T35A and T36A share a common input with a predominate state of high. Rules 1 through 4 described infra have been applied. PFET T33A is a thin gate dielectric/high VT PFET, PFET T34A is a thin gate dielectric PFET with a $V_T$ less than that of a high VT PFET and NFETs T35A and T36A are thick gate dielectric/low VT NFETs.

In FIG. 11B, PFET T33B and T34B, and NFETs T35B and T36B are stacked between VDD and GND and the gates of PFETs T33B and T34B and NFETs T35B and T36B share a common input with a predominate state of low. Rules 1 through 4 described infra have been applied. PFETs T33B and T34B are thick gate dielectric/low $V_T$ PFETs, NFET T35B is a thin gate dielectric NFET with a VT less than that of a high VT NFET and NFET T36B is a thin gate dielectric/high VT NFET.

Another type of monotonic CMOS circuit is a dynamic domino circuit. Domino circuits can be treated in the same manner as pulsed state logic circuits in far a reducing leakage current by the method of the present invention.

Figure 12A:
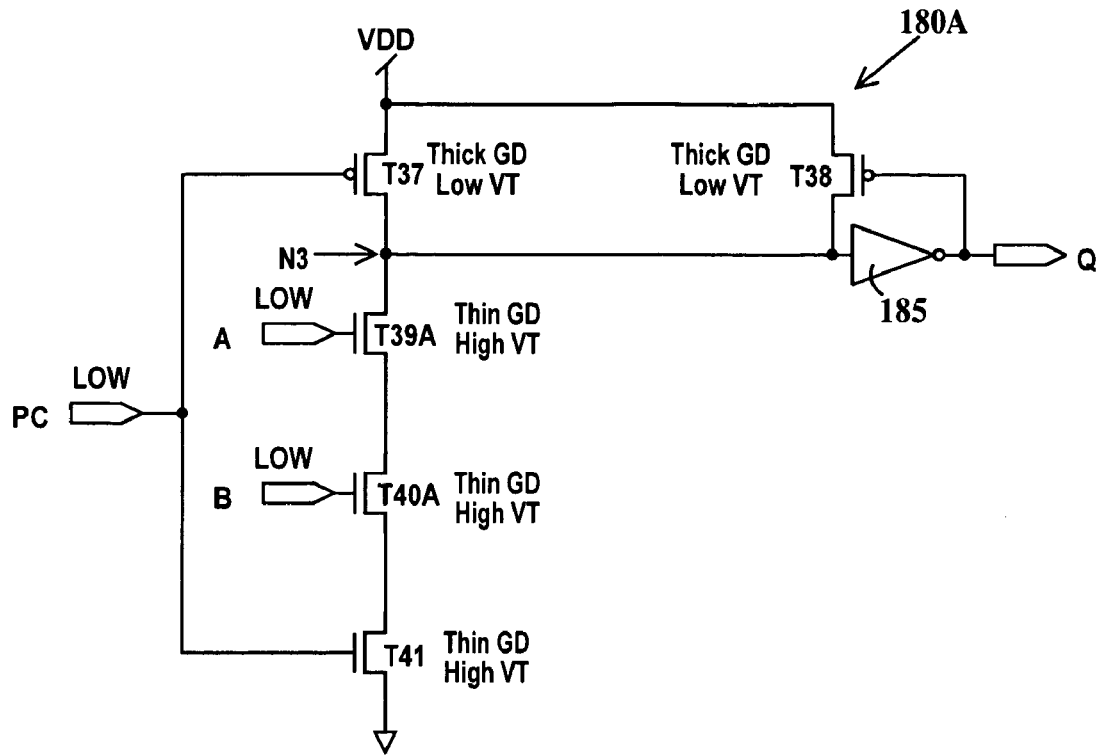
FIGS. 12A, 12B, 13A and 13B are schematic circuit diagrams of exemplary NAND domino circuits according to the present invention.

FIGS. 12A, 12B, 13A and 13B are schematic circuit diagrams of exemplary NAND domino circuits according to the present invention. In FIG. 12A, a NAND gate 180A includes PFETs T37 and T38, NFETs T39A, T40A and T41 and an inverter 185. The sources of PFETS T37 and T38 are connected to VDD. The drains of PFETs T37 and T38 are connected to the drain of NFET T39A and the input of inverter 185. The source of NFET T39A is connected to the drain of NFET T40A. The source of NFET T40A is connected to drain of NFET T41 and source of NFET T41 is connected to GND. The output of inverter 185 is connected to an output Q and to the gate of PFET T38. The gates of PFET T37 and T41 are connected to a precharge clock (PC), the gate of NFET T39A is connected to an input A and the gate of NFET T40A is connected to an input B. The predominate states of precharge clock PC, input A and input B are low.

In operation, during a precharge phase, PC is low, PFET T37 charges a node N3 high (VDD), driving output Q low (GND) and turning on PFET T38. NFET T41A is off, interrupting the path to GND during the precharge phase. When precharge clock transitions high, the evaluate phase is enabled. With a high on inputs A and B, node N3 is coupled to GND switching the output of inverter 185 high and turning off PFET T38.

In FIG. 12A, rules 1 and 2 for reducing leakage current described supra have been applied to NAND gate 180A. Therefore, PFETs T37 and T38 (and optionally the PFET of inverter 185) are thick gate dielectric/low VT PFETs and NFETs T39A, T40A, T41 (and optionally the NFET of inverter 185) are thin gate dielectric/high VT NFETs.

Figure 12B:
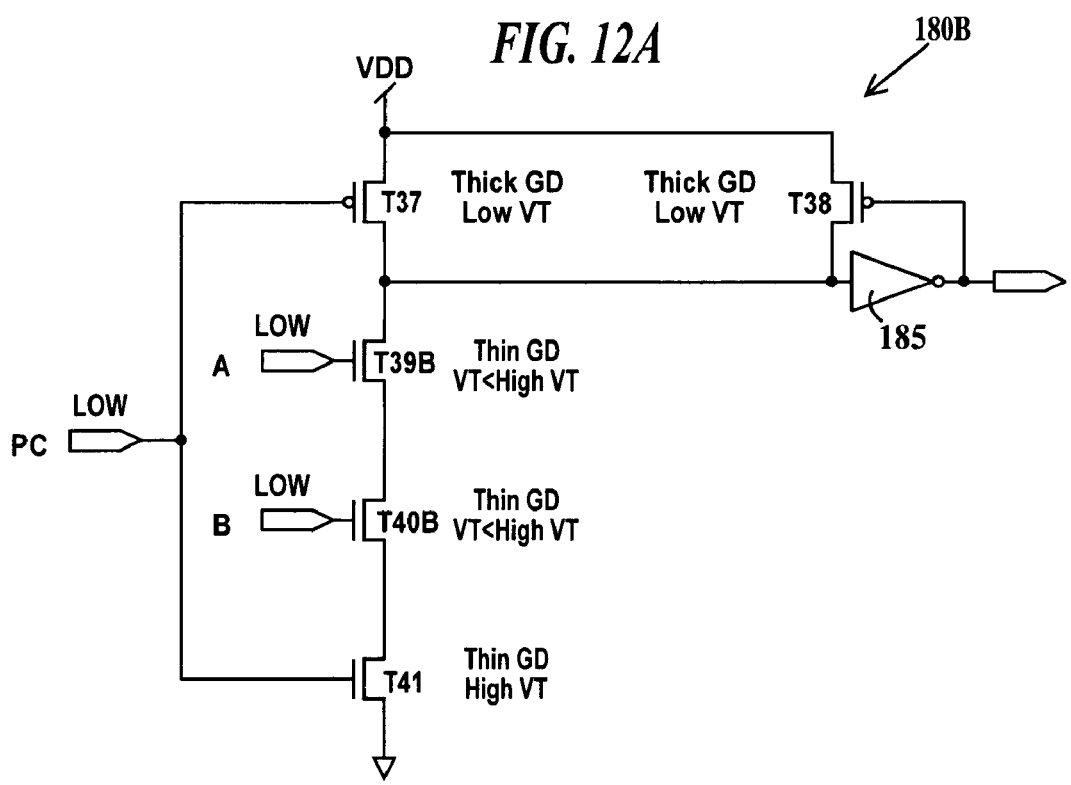

In FIG. 12B, NAND gate 180B is similar to NAND gate 180A of FIG. 12A except that NFET T39A is replaced with NFET T39B and NFET T40A is replaced with NFET T40B. Not only have rules 1 and 2, but also rules 3 and 4 for reducing leakage current described supra have been applied to NAND gate 180B. Thus NFETs T39B and T40B are thin gate dielectric NFETs with $V_T$s less than that of a high VT NFET.

Figure 13A:
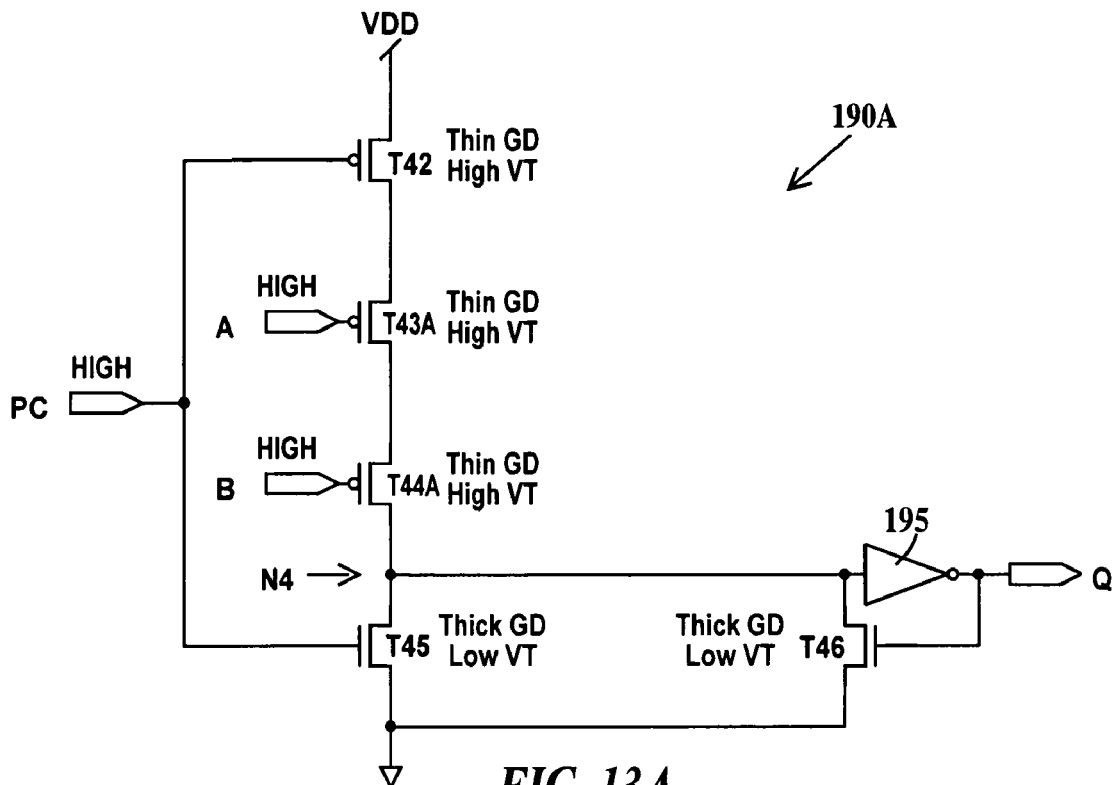

In FIG. 13A, NAND gate 190A is precharged low and the predominate states of precharge clock PC, input A and input B is high. Rules 1 and 2 for reducing leakage current described supra have been applied to NAND gate 190A. Therefore, PFETs T42, T43A and T44A (and optionally the PFET of inverter 195) are thin gate dielectric/high VT PFETs and NFETs T45 and T46 (and optionally the NFET of inverter 195) are thick gate dielectric/low VT NFETs.

Figure 13B:
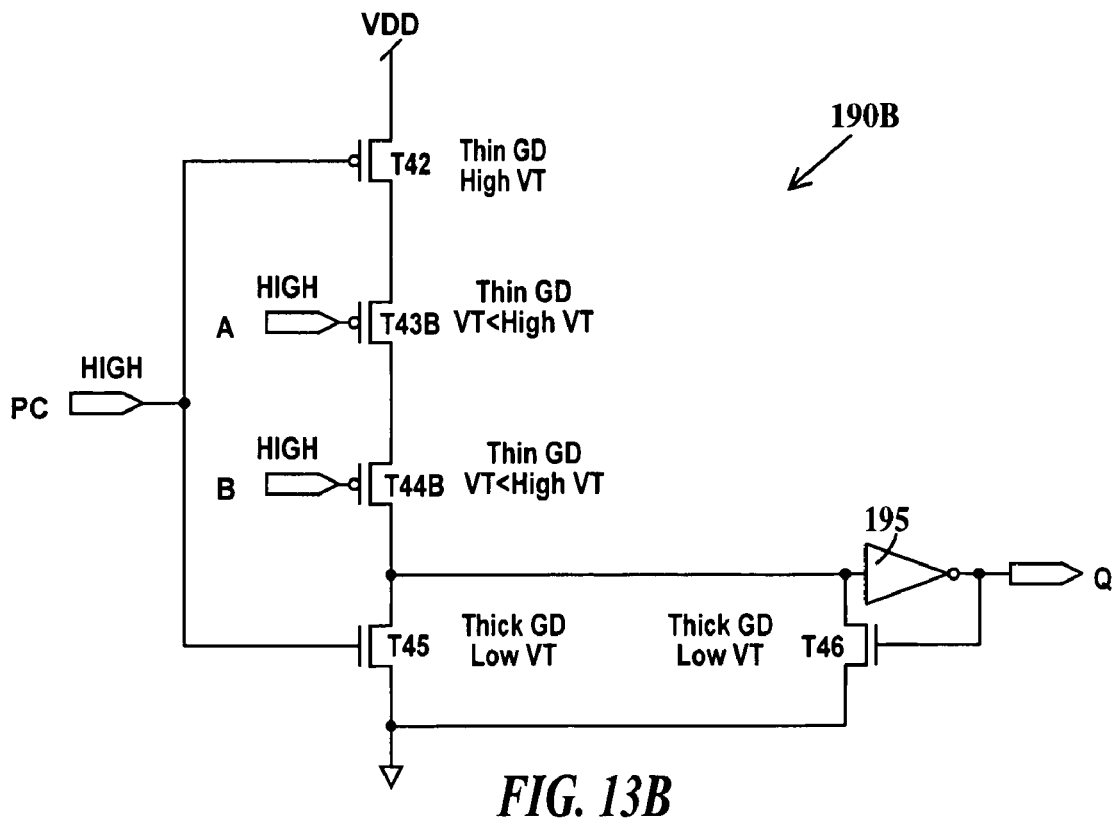

In FIG. 13B, NAND gate 190B is similar to NAND gate 190A of FIG. 13A except that PFET T43A is replaced with PFET T43B and PFET T44A is replaced with PFET T44B. Not only have rules 1 and 2, but also rules 3 and 4 for reducing leakage current described supra have been applied to NAND gate 190B. Thus PFETs T43B and T44B are thin gate dielectric PFETs with $V_T$s less than that of a high VT PFET.

Fuses are often used to set various functions of integrated circuit chips. Fuses are an ultimate expression of a predominate state in that they are either open or shorted and most fuses are left shorted (except in the case of antifuses which are most often left open) or unprogrammed. Thus fuse evaluation circuits comprise another possible class of monotonic CMOS circuit that the present invention may be applied to.

Figure 14A:
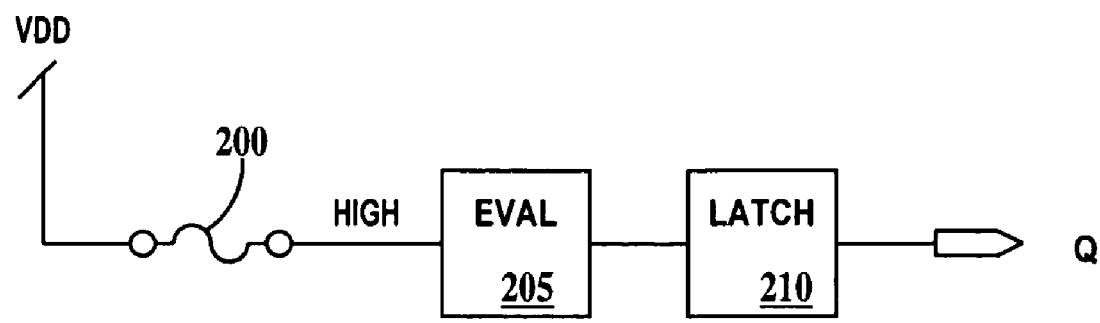
FIGS. 14A and 14B are schematic circuit diagrams illustrating the application of the present invention to fuse containing circuits.
Figure 14B:
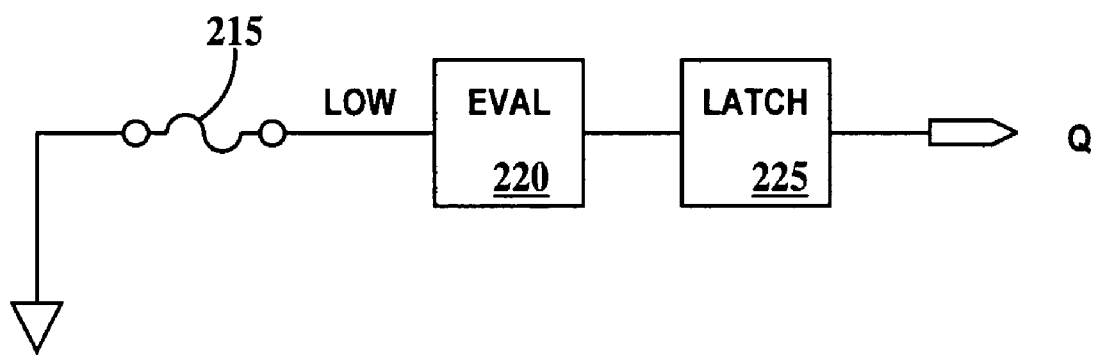

FIGS. 14A and 14B are schematic circuit diagrams illustrating the application of the present invention to fuse containing circuits. In FIG. 14A, a fuse 200 is coupled between VDD and the input to an evaluation circuit 205 for evaluating the state of the fuse. The output of evaluation circuit 205 is coupled to a latch 210 for latching the evaluated state of the fuse. Evaluation circuit 205 may contain pulsed CMOS combinational logic or combination domino logic, the gate dielectric thickness and $V_T$ of the NFETs and PFETs thereof are adjusted based on rules 1 and 2 and optionally rules 3 and 4 as well for reducing leakage current with a predominate input level high as described supra.

In FIG. 14B, a fuse 215 is coupled between GND and the input to an evaluation circuit 220 for evaluating the state of the fuse. The output of evaluation circuit 220 is coupled to a latch 225 for latching the evaluated state of the fuse. Evaluation circuit 225 may contain pulsed CMOS combinational logic or combination domino logic, the gate dielectric thickness and $V_T$ of the NFETs and PFETs thereof are adjusted based on rules 1 and 2 and optionally rules 3 and 4 as well for reducing leakage current with a predominate input level low as described supra.

Figure 15:
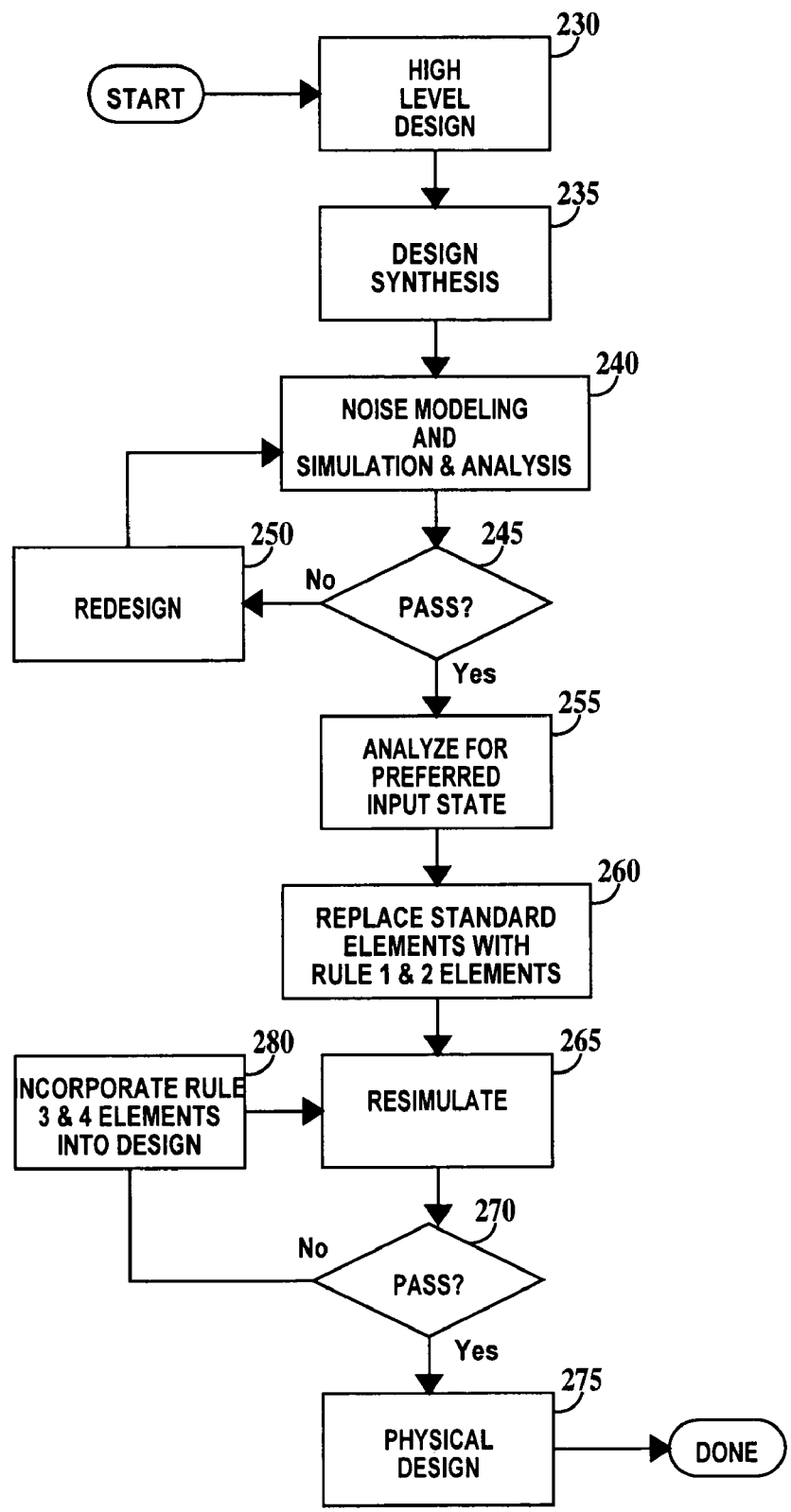
FIG. 15 is a flowchart illustrating a method of designing a low leakage current monotonic CMOS circuit according to the present invention.

FIG. 15 is a flowchart illustrating a method of designing a low leakage current monotonic CMOS circuit according to the present invention. In step 230, a high level design for an integrated circuit chip is created. In step 235, design synthesis is performed based on the high level design by assembling standard design elements from a synthesis library into a schematic design representation of the high level design (i.e. a netlist). The standard design elements in the synthesis library include individual transistors, cells, gates, macros and cores utilizing PFETs and NFETs having reference gate dielectric thicknesses and reference VTs. Thus, a standard design element is defined herein as a design element utilizing reference NFETs and/or reference PFETs as described supra. The synthesis library also includes reduced leakage current design elements having NFETs and PFETs having combinations of thick and thin gate dielectric and high and low $V_T$ according to rules 1 and 2 described supra for reducing leakage current. Additionally, the synthesis library may optionally include reduced leakage design elements having NFETs and PFETs having combinations of thick and thin gate dielectric and ranges of $V_T$ that are consistent with rules 3 and 4 described supra for reducing leakage current. In step 240, noise modeling and analysis of a noise model generated from the schematic design as well as simulation and timing analysis are performed on the schematic design. Leakage current analysis may also be performed. Next, in step 245, it is determined if the design passes noise and timing specification. If in step 245, the design does not passes, the method proceeds to step 250, where based on the analysis performed in step 240, the netlist design may be modified, again using standard design elements, otherwise the method proceeds to step 255.

In step 255, the design is analyzed for predominate states of all inputs for all or selected monotonic CMOS logic circuits within the design. Then, in step 260, for all or a subset of those monotonic CMOS logic circuits selected in step 255 that have all inputs with a predominate and same state, standard elements are replaced with rule 1 and 2 based low leakage elements from the synthesis library having the same functions as the standard elements they are replacing.

Next, in step 265, re-simulation, timing and leakage current analysis are performed on the modified schematic design. In step 270 it is determined if timing and leakage current targets have been met. If timing or leakage current targets have been met, the method proceeds to step 275, where physical design is performed, converting the schematic design into a shapes file that will be used to generate the mask set to fabricate the circuit, otherwise the method proceeds to step 280. In step 280, selected rule 1 and 2 reduced leakage elements are replaced with corresponding rule 3 and 4 reduced leakage elements from the synthesis library and the method loops to step 265.

Several modifications may be made to the above design flow. First, reduced leakage current elements may be incorporated directly into the design synthesis at step 235, especially in more mature circuit design families. Second, steps 265 and 270 may be skipped. Third, in step 280 instead of rule 3 and 4 reduced leakage elements being used other rule 1 and 2 reduced leakage current design elements may be used. The point being, the use of rule 3 and 4 reduced leakage current elements is optional. Fourth, The designer may use special design elements (i.e. design elements that are not in the design library) created by the designer at any time during the design activity based on rules 1 and 2 and optionally rules 3 and 4 and not be limited to those in the design library.

Figure 16:
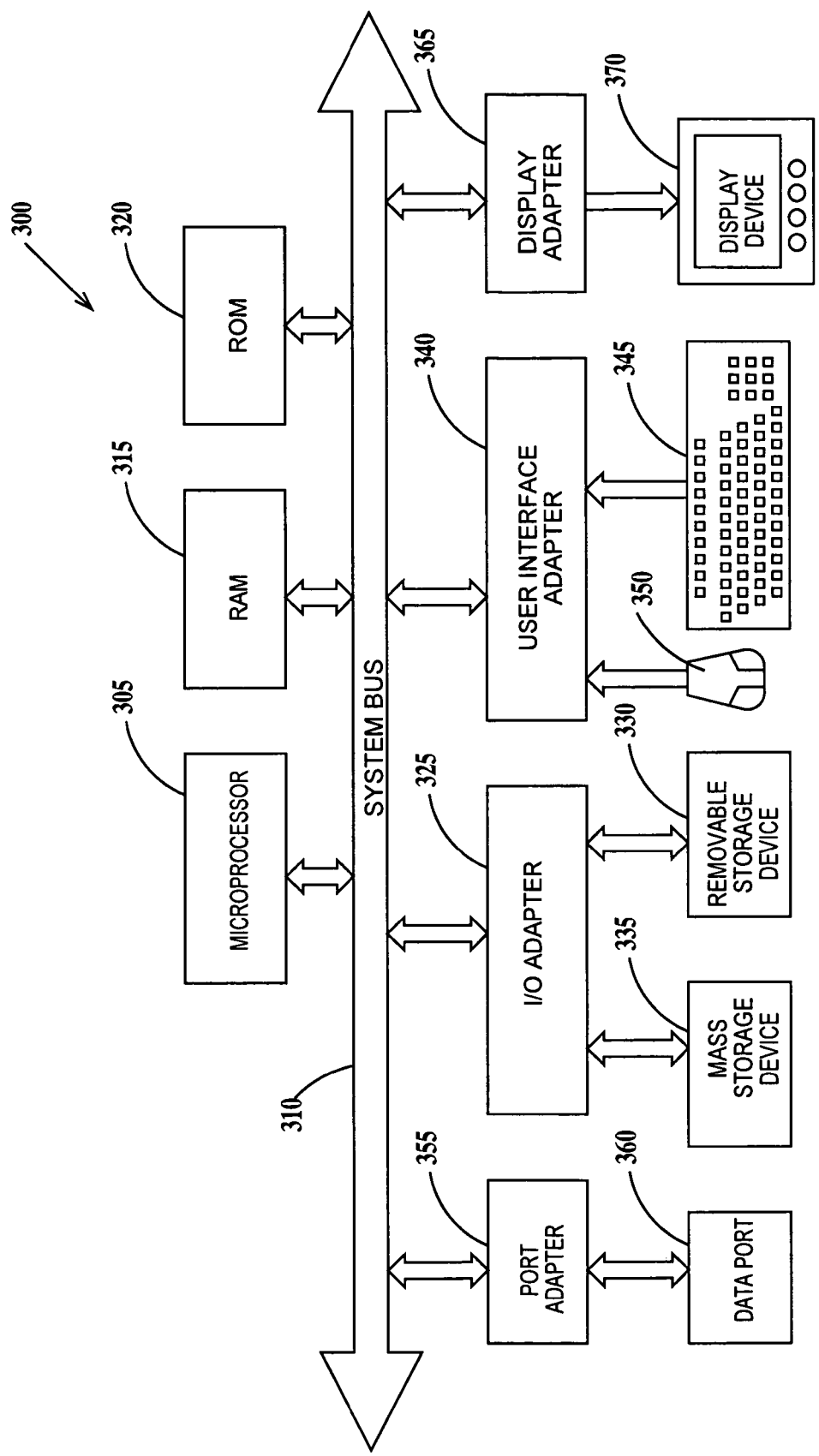
FIG. 16 is a schematic block diagram of a general-purpose computer for practicing the present invention.

Generally, the method described herein with respect to the method of designing a low leakage current monotonic CMOS circuit is practiced with a general-purpose computer and the method may be coded as a set of instructions on removable or hard media for use by the general-purpose computer. FIG. 16 is a schematic block diagram of a general-purpose computer for practicing the present invention. In FIG. 16, computer system 300 has at least one microprocessor or central processing unit (CPU) 305. CPU 305 is interconnected via a system bus 310 to a random access memory (RAM) 315, a read-only memory (ROM) 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

ROM 320 contains the basic operating system for computer system 300. The operating system may alternatively reside in RAM 315 or elsewhere as is known in the art. Examples of removable data and/or program storage device 330 include magnetic media such as floppy drives and tape drives and optical media such as CD ROM drives. Examples of mass data and/or program storage device 335 include hard disk drives and non-volatile memory such as flash memory. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 330, fed through data port 360 or typed in using keyboard 345.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of designing a monotonically operated CMOS circuit with reduced current leakage, comprising;
   (a) specifying a reference PFET having its threshold voltage and its gate dielectric thickness and a reference NFET having its threshold voltage and its gate dielectric thickness;
   (b) synthesizing a schematic circuit design with standard design elements, said standard design elements including one or more reference PFETS and one or more reference NFETs;
   (c) analyzing one or more circuits for logic stages having predominantly high input logic states or predominantly low input logic states;
   (d) selecting one or more logic stages determined to have predominantly high input logic states or predominantly low input logic states; and
   (e) replacing said standard design elements of said selected logic stages with reduced current leakage elements, said reduced current leakage elements including:
      thin gate dielectric and high threshold voltage PFETs with respect to said reference PFET, for logic stages having predominantly high input states;
      thick gate dielectric and low threshold voltage NFETs with respect to said reference NFET, for logic stages having predominantly high input states;
      thick gate dielectric and low threshold voltage PFETs with respect to said reference PFET, for a logic stages having predominantly low input states; and
      thin gate dielectric and high threshold voltage NFETs with respect to said reference NFET, for said logic stages having predominantly low input states.

2. The method of claim 1 wherein said reduced current leakage elements further include:
   high intermediate NFETs having thick gate dielectrics and low threshold voltages with respect to said reference NFET defined for logic stages having said predominantly high inputs, said high intermediate NFETs stacked in series between said thin gate dielectric and high threshold voltage PFETs and said thick gate dielectric and low threshold voltage NFETs;
   high intermediate PFETs having thin gate dielectrics with respect to said reference PFET and threshold voltages less than that of said high threshold voltage PFETs defined for logic stages having said predominantly high inputs, said high intermediate PFETs stacked in series between said thin gate dielectric and high threshold voltage PFETs and said thick gate dielectric and low threshold voltage NFETs;
   low intermediate NFETs having thin gate dielectrics with respect to said reference NFET and threshold voltages less than that of said high threshold NFETs defined for logic stages having said predominantly low inputs, said low intermediate NFETs stacked in series between said thin gate dielectric and high threshold voltage PFETs and said thick gate dielectric and low threshold voltage NFETs; and
   low intermediate PFETs having thick gate dielectrics and low threshold voltages with respect to said reference PFET defined for logic stages having said predominantly low inputs, said low intermediate PFETs stacked in series between said thin gate dielectric and high threshold voltage PFETs and said thick gate dielectric and low threshold voltage NFETs.

3. The method of claim 1, further including:
   (f) analyzing the performance of said logic stages with said reduced leakage current elements; and
   (g) replacing selected logic stages having been previously replaced with said reduced leakage current elements with reduced current elements further including:
      high intermediate NFETs having thick gate dielectrics and low threshold voltages with respect to said reference NFET defined for logic stages having said predominantly high inputs, said high intermediate NFETs stacked in series between said thin gate dielectric and high threshold voltage PFETs and said thick gate dielectric and low threshold voltage NFETs;
      high intermediate PFETs having thin gate dielectrics with respect to said reference PFET and threshold voltages less than that of said high threshold voltage PFETs defined for logic stages having said predominantly high inputs, said high intermediate PFETs stacked in series between said thin gate dielectric and high threshold voltage PFETs and said thick gate dielectric and low threshold voltage NFETs;

low intermediate NFETs having thin gate dielectrics with respect to said reference NFET and threshold voltages less than that of said high threshold NFETs defined for logic stages having said predominantly low inputs, said low intermediate NFETs stacked in series between said thin gate dielectric and high threshold voltage PFETs and said thick gate dielectric and low threshold voltage NFETs; and low intermediate PFETs having thick gate dielectrics and low threshold voltages with respect to said reference PFET defined for logic stages having said predominantly low inputs, said low intermediate PFETs stacked in series between said thin gate dielectric and high threshold voltage PFETs and said thick gate dielectric and low threshold voltage NFETs.

4. The method of claim 1, wherein all PFETs of said reduced leakage current elements are selected from the group of PFETs consisting of thin gate dielectric and high threshold voltage PFETs for logic stages having predominantly high input states and thick gate dielectric and low threshold voltage PFETs for a logic stages having predominantly low input states.

5. The method of claim 1, wherein all NFETs of said reduced leakage current elements are selected from the group of NFETs consisting of thick gate dielectric and low threshold voltage NFETs for logic stages having predominantly high input states and thin gate dielectric and high threshold voltage NFETs for said logic stages having predominantly low input states.

6. The method of claim 1, wherein said predominantly high input state and said predominantly low input state are independently selected from the group of states consisting of precharge states, standby states, output states of combinational logic coupled to said circuit and output states of logic stages of said circuit.

* * * * *